United States Patent
Blish, II

[11] Patent Number: 5,914,873
[45] Date of Patent: Jun. 22, 1999

[54] DISTRIBUTED VOLTAGE CONVERTER APPARATUS AND METHOD FOR HIGH POWER MICROPROCESSOR WITH ARRAY CONNECTIONS

[75] Inventor: Richard C. Blish, II, Saratoga, Calif.

[73] Assignee: Advanced Micro Devices, Sunnyvale, Calif.

[21] Appl. No.: 08/885,677

[22] Filed: Jun. 30, 1997

[51] Int. Cl.[6] ........................................ H02M 1/14
[52] U.S. Cl. ...................... 363/147; 363/146; 361/420; 361/761
[58] Field of Search ...................... 363/147, 146, 363/98, 97, 17, 132; 361/420, 795, 409; 174/52.4, 68.5; 357/74

[56] References Cited

U.S. PATENT DOCUMENTS

| | | | |
|---|---|---|---|
| 5,161,098 | 11/1992 | Balakrishnan | 363/144 |
| 5,384,691 | 1/1995 | Neugebauer et al. | 361/794 |
| 5,479,115 | 12/1995 | Ueda et al. | 326/63 |
| 5,608,617 | 3/1997 | Morrison et al. | 363/147 |

*Primary Examiner*—Peter S. Wong
*Assistant Examiner*—Rajnikant B. Patel

[57] ABSTRACT

The present invention provides a relief to the low voltage, high current spiral trend being seen in the microprocessor industry. A microprocessor module is designed to receive a voltage V2, which is substantially higher than a logic gate utilization voltage V3. V2 is supplied at a current rating of I2 to a plurality of within-module voltage converters, designated as 220a, 220n, which directly distribute voltage V3 and the appropriate current portion I3 to the respective logic gates 210. Preferably, voltage V2 is substantially greater in magnitude than voltage V3, typically V2:V3 being at least 5:1 but preferably 40:1 to as much as 100:1. By example, V2=50 vdc, I2=3 amps and V3=1.0 vdc would satisfy the ratio considerations. The microprocessor loads serviced by the present invention constitute millions of logic gates requiring low voltages ranging from 0.75 Vdc to 1.5 Vdc. Other microprocessor loads, such as cache, can be powered with flip chip technology using the technique of the present invention. A selected number of microprocessor logic gates, designated as numeral 210, are powered through electrical interconnections 205 (bumps), from respective voltage converters 220a . . . 220n. Each voltage converter includes power conversion components, namely a pre-regulator pulse width modulator controller circuit 223, a thin film transformer 221, and output voltage regulator circuit 222 embedded in deep wells of substrate 230.

21 Claims, 4 Drawing Sheets

DISTRIBUTED VOLTAGE CONVERTER APPARATUS AND METHOD FOR HIGH POWER MICROPROCESSOR WITH ARRAY CONNECTIONS

TECHNICAL FIELD

The present invention relates to microprocessors and other integrated circuit devices requiring low voltage and high current power input requirements. More particularly, the present invention relates to microprocessor and other integrated circuit devices requiring low voltage and high current power requirements and power conversion circuitry for delivering the required power. More particularly, the present invention relates to microprocessor and other integrated circuit devices requiring low voltage and high current power input requirements and on-board power conversion apparatus and methods for delivering the power requirements.

BACKGROUND ART

Figure 1:
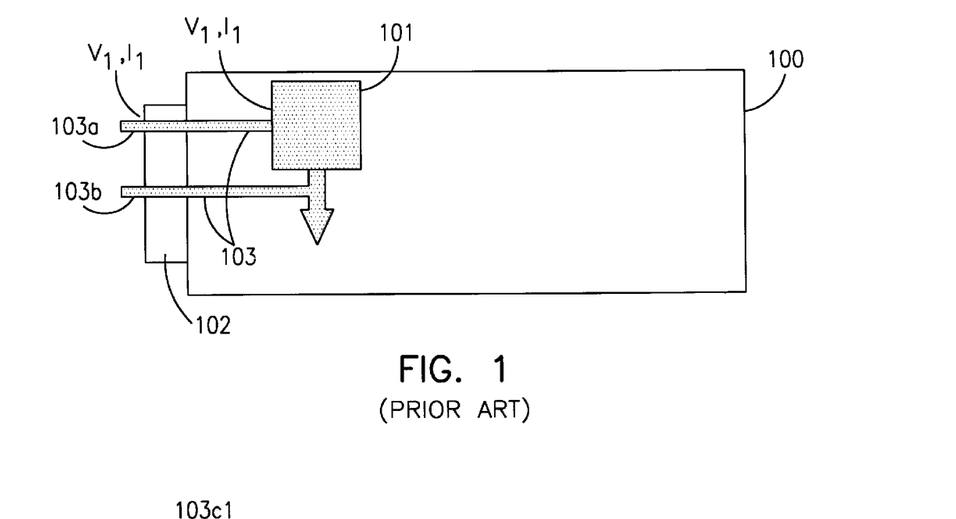
FIG. 1 is a block diagram representation of prior art method of supplying low voltage at high current to a microprocessor load.
Figure 2:
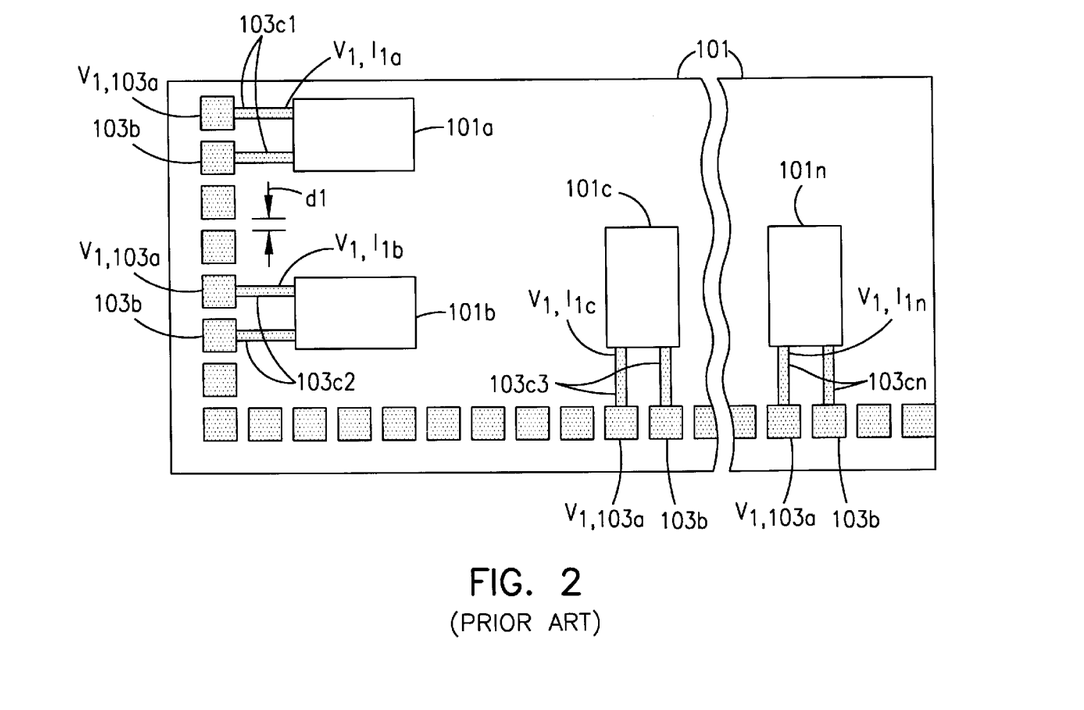
FIG. 2 is a block diagram representation of a dense input/output pad and circuit land artwork associated with the prior art manner of distributing low voltage and high current to microprocessor loads.

The trend in power requirements for microprocessor loads and other microelectronic load circuitry is to use lower voltages at higher currents, approaching 1.0 Vdc to 1.5 Vdc and in excess of 100 amperes, respectively. This low voltage, high current power requirement trend is based on implementing new technologies, such as in wafer fabrication for new microprocessor logic circuitry, which will have increased chip sizes, gate count and clock frequency. Presently, voltage and current power requirements for microprocessor logic circuitry are such that they can be met by directly inputting the supply logic voltage, by example, 3 Vdc at tens of amperes, directly to a plurality of pins designated for receiving the supply logic voltage at the high currents directly for use by the microprocessor loads. FIGS. 1 and 2 collectively show a microprocessor chip, according to the prior art manner of supplying the supply logic voltage and current directly to the microprocessor load from electrical connectors and conductor patterns provided on printed wiring boards (PWB). The prior art method of supplying the logic voltages directly results in having input pins rated for high currents, wide circuit land patterns that have high power dissipation in the form of IR drops, the high density of land patterns carrying the large amount of current in parallel. In addition, the relatively large effective inductance (long distances), result in Ldi/dt concerns as sources for rf transmission (noise) that impact data integrity. As indicated above, the power dissipation forecast indicates that future generations of microprocessor chips will be larger in size, exhibiting higher gate count, faster clock frequencies and decreasing operational voltage. Projected voltage and current requirements indicate operational voltages in the range of 0.75 Vdc to 1.5 Vdc at 100 w (100 amps) of power. The practicality of supplying the operational power to future generations of microprocessors is not favorable considering the known reliability problems associated with multiple wiring paths, IR drop, high inductance, Ldi/dt considerations, bus width (IC circuit lands), and the quantity of lines being switched, and faster clock frequencies. To applicant's knowledge there are no known microprocessor topologies that are addressing the low voltage distribution problem by incorporating on-board voltage converters, (i.e. within the chip or module), to alleviate the problem associated with supplying the operational voltage directly to the microprocessor.

Accordingly, a need is seen to exist for an integrated circuit device, such as a microprocessor integrated circuit device, that is rated for receiving an input voltage that is higher than the device's operational voltage, and that is provided with a plurality of voltage converters that convert the high input voltage to the lower operational voltage for delivery to selected load groups of the integrated circuit device.

It is therefore a primary object of the present invention to provide a microprocessor integrated circuit device, that is rated for receiving an input voltage that is higher than the device's operational voltage, and that is provided with a plurality of voltage converters that convert the high input voltage to the lower operational voltage for delivery to selected load groups of the integrated circuit device.

DISCLOSURE OF INVENTION

Accordingly, the foregoing objects are accomplished by providing an integrated circuit device rated for receiving an input voltage that is higher in magnitude than the operational voltage needed by the integrated circuit, that is provided with electrical conductors that distribute the high input voltage to a plurality of voltage converters that are also provided at the point of consumption of the low operational voltage. The integrated circuit device includes input pin and micro-electrical conductor means for receiving and distributing the input high voltage to the plurality of voltage converters and is preferably wattage-rated in the range of 25 to 250 watts. The high input voltage source supplies the plurality of voltage converters for converting the high voltage to a low voltage, such as converting 50 volts to 1.0 volt for distributing to a plurality of loads on the integrated circuit, by example gates and cache on a microprocessor module. The apparatus of the present invention, while having to sustain higher input voltages, benefits in that the input current to the integrated circuit device is substantially reduced when compared to prior art integrated circuit devices, such as microprocessor devices. The reduced input current not only impacts the input pin rating, but also greatly impacts the quantity of input pins needed for power, the internal packaging density of the micro-conductor circuit interconnections for distributing the high voltage and lower currents to the individual voltage converters. The micro-conductor circuit interconnections are commonly referred to as circuit lands. The quantity of converters is determined by the design requirements of the integrated circuit device, and accordingly, determine the rating of the integrated circuit apparatus of the present invention. By example, a microprocessor requiring 1.8 Vdc/120 w means 1.8 Vdc at approximately 66 amps. By employing the present invention, 66 voltage converter arrays may be provided within the substrate structure of the microprocessor module to receive a 50 Vdc input voltage for converting to 1.8 Vdc, (approximately a 27 fold increase in the supply voltage in this particular example). Each voltage converter would be rated for delivering the 1.8 Vdc at 1.0 amps to satisfy the overall microprocessor load requirements. The input pins of the microprocessor module would be arranged and rated for conducting 2.4 amps instead of being arranged and rated for conducting the 66 amps, (approximately a 27 fold decrease in the supply current in this particular example). Further, the internal circuit land patterns would arranged for distributing approximately 36 milli-amps to the input of each voltage converter, resulting in a noticeable decrease in density and size of circuit lands. A 50 Vdc magnitude will adequately meet the capability of the integrated circuit wafer. The distribution and placement of the local voltage converters is on selected layers of a multilayer substrate.

Other features of the present invention are disclosed or apparent in the section entitled: "BEST MODE FOR CARRYING OUT THE INVENTION."

BRIEF DESCRIPTION OF DRAWINGS

For fuller understanding of the present invention, reference is made to the accompanying drawing in the following detailed description of the Best Mode of Carrying Out the Present Invention. In the drawings.

Reference numbers refer to the same or equivalent parts of the present invention throughout the several figures of the drawing.

BEST MODE FOR CARRYING OUT THE INVENTION

FIG. 1 is a block diagram representation of a printed wiring board (PWB) 100 with a microprocessor module 101 shown being powered by a power input topology according to prior art methods of supplying a low voltage V1 at a high current I1 from leads 103a and 103b which are power input lead members of the printed wiring board's input/output connector arrangement 102. Microprocessor 101 constitutes millions of logic gates requiring low voltages typically ranging from 1.00 Vdc to 3.0 Vdc at currents in excess of 100 amperes to 30 amperes, respectively. Voltage V1 and current I1 are distributed to microprocessor 101 using electrical interface means 103, such as metalized land patterns 103. FIG. 2 shows an integrated circuit (IC) representation of microprocessor 101 having a plurality of electrical interface means 103c1, 103c2, 103c3 . . . 103cn receiving input low voltage V1 through pairs of pads (103a, 103b) and distributing low voltage V1 and high current portions I1a, I1b . . . I1n to a plurality of microprocessor gate loads 101a, 101b, 101c . . . 101n. The prior art topology forces the load currents to be typically in the tens of milli-amperes range. By example, using the prior art topology depicted in FIG. 1 and 2, for supplying 1.5 Vdc, at 20 amps, to a 12×18 mm processor chip with 1500 leads, the pin allocation is typically as follows: 350 leads are allocated as leads for power, 350 leads are allocated for ground and 800 leads are allocated for data input/output (I/O). If employing wire bonding techniques, the physical size forces a pad pitch of about 40 um, see numeral d1 in FIG. 2, which seriously impacts the manufacturability, practicability and routeability of the wire bonding technique. If a contemporary 1.5 Vdc/20A power requirement were implemented on a 40 um pad pitch, the 20 amps shared among the 350 power lines would result in approximately 40 mA per line, or trace. If current density limit per circuit land were 1 mA/um of width, the land width to carry the 40 mA would need to be 40 um wide causing a crowded chip surface and creating nearly impossible routing problems. Other reliability issues arise due to the crowded surface, namely IR drop, inductance, rf transmission (noise) impacting data integrity. The crowded chip surface conditions also impact IC packaging costs, module size, complexity and, as stated previously, a major rf noise source. According to industry forecasts, the power dissipation trend is upward with gate voltages decreasing to 1.0 Vdc, 100 w (100 amps). Obviously, if the prior art techniques are employed for future microprocessor chip fabrication, the problems seen presently, will be greater, due to the use of multiple wiring paths, IR drop, high inductance/Ldi/dt considerations, and generally larger bus width (IC circuit lands) delivering the power. Table 1.0 exemplifies the problem for the above discussed power requirement trends.

TABLE 1

| | | | | Decreasing Voltage/Increase Power Trend | | | | |
|---|---|---|---|---|---|---|---|---|
| Voltage V | Power watts | Amps I | footprint mm | wire pitch um | trace width um | trace as % pitch approx. | lead count | compare route |
| 2.5 | 20 | 8 | 10 × 16 | 52 | 24 | 46 | 1000 | good |
| 2.0 | 20 | 10 | 7 × 11 | 36 | 30 | 83 | 1000 | poor |

TABLE 1-continued

Decreasing Voltage/Increase Power Trend

| Voltage V | Power watts | Amps I | footprint mm | wire pitch um | trace width um | trace as % pitch approx. | lead count | compare route |
|---|---|---|---|---|---|---|---|---|
| 1.5 | 30 | 20 | 12 × 18 | 40 | 40 | 100 | 1500 | poor |
| 1.0 | 50 | 50 | 15 × 25 | 32 | 60 | >100 | 2500 | No |
| 1.0 | 100 | 100 | 12 × 18 | 24 | 120 | >>100 | 2500 | No |

Figure 3:
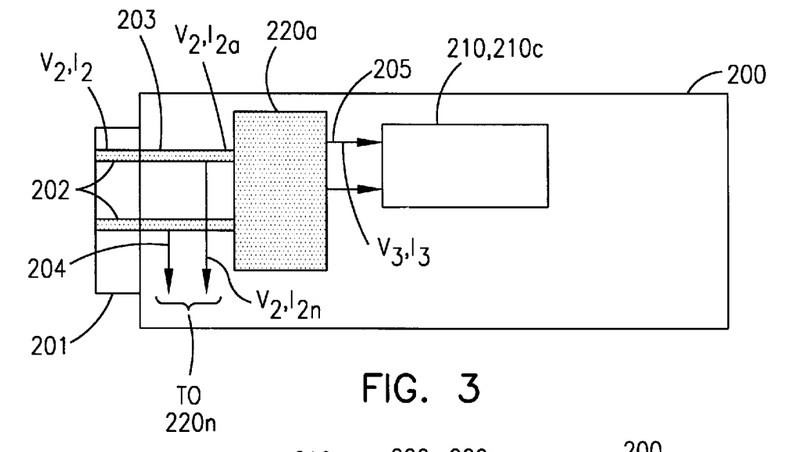
FIG. 3 is a block diagram representation of the method of generating the low voltage on-board a microprocessor integrated circuit in accordance with the present invention.

The present invention is believed to provide a relief to the low voltage, high current spiral trend being seen in the microprocessor industry. FIG. 3 is a generalized power flow schematic block diagram of a microprocessor system module 200, (commonly a printed wiring board, PWB), in accordance with the present invention. According to a preferred embodiment, a voltage V2, which is substantially higher than a logic gate utilization voltage V3, is supplied at a current rating of I2 to a plurality of within-chip modular voltage converters 220a, 220n. As shown in FIG. 3 current I2 is distributed as current I2a flowing to voltage converter 220a and as current I2n flowing to other voltage converters 220n via traces 204. Each voltage converter directly distributes voltage V3 and the appropriate current portion I3 to the respective logic gates 210 and cache 210c. Logic gates 210 and cache 210c (level 1) are shown beside the converters in FIG. 3 for clarity, but it is envisioned that their footprints would be superimposed as shown in the central portion of FIG. 4. Preferably, voltage V2 is substantially greater in magnitude than voltage V3, typically V2:V3 being at least 5:1, but preferably 40:1 to as much as 100:1. In accordance with the present invention, V2 is the larger voltage, as such, the magnitude of the input current I2 can now be reduced in comparison with prior art methods. By example, for a microprocessor system module requiring 1.0 Vdc and 100 watts (100 amps) of power, the power requirements can be generally satisfied by an input voltage V2=50 Vdc and input current I2=2 amps. The 100 amp load current would be delivered as individual currents I3n, from the array of n voltage converters to respective logic gates 210 and cache 210c. The I3n current value from any individual voltage converter in the array will vary inversely with the number of inverters, thus as the square of the inverter pitch. By example, a pitch of 1.5 mm will satisfy this relationship when I3n=1 amp. For the foregoing power requirement of 1.0 Vdc and 100 watts (100 amps), an implementation arrangement of 100 voltage converters, each rated at 1.0 Vdc/1.0 amp, within the microprocessor system module would adequately meet these needs. As illustrated, a high voltage V2 at a low current I2 is supplied to microprocessor system module 200 through leads 202 which are power input lead members of the module's input/output lead arrangement 201. From the input leads, high voltage V2 and corresponding low currents I2a, I2n are distributed to a plurality of voltage converters 220a, 220n through substrate electrical interconnections, or traces 203, 204. The microprocessor loads serviced by the present invention constitute millions of logic gates and cache requiring low voltages ranging from 0.75 Vdc to 1.5 Vdc. By example, SRAM (static random access memory) cache using flip chip technology can be powered using the technique of the present invention. A selected number of microprocessor logic gates, designated as numeral 210, would be powered through electrical interconnections 205, referred to as bumps when employing flip chip technology, from an array of respective voltage converters 220n.

Figure 4:
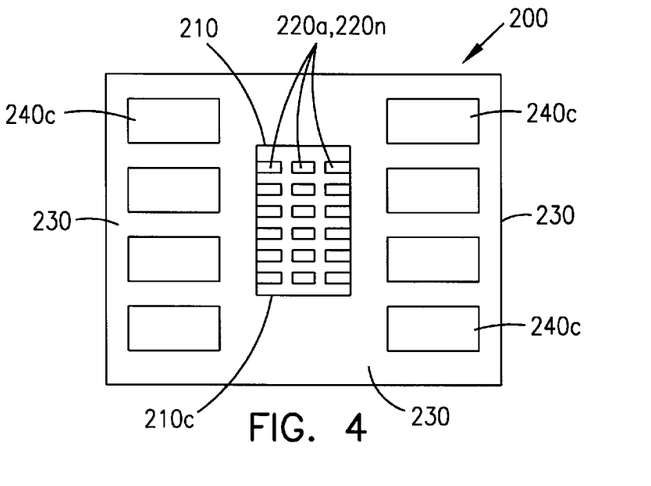
FIG. 4 is a block diagram overview of a microprocessor module having a plurality of on-board high voltage-to-low voltage converters in accordance with the present invention.
Figure 5:
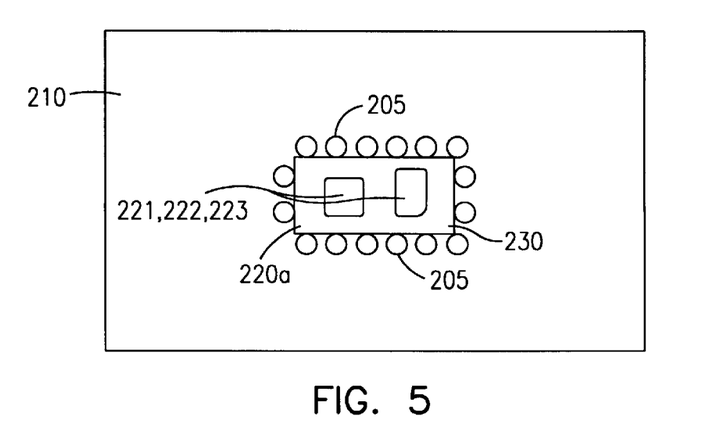
FIG. 5 is a block diagram representation of a section of a microprocessor load adapted for being energized from one of the plurality of voltage converters in accordance with the present invention.
Figure 6:
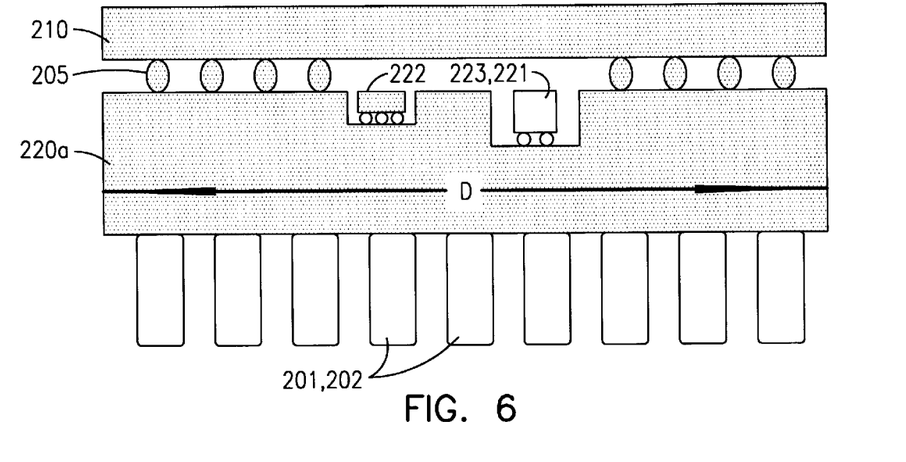
FIG. 6 is an enlarged section of a microprocessor chip illustrating a voltage converter's components disposed within the substrate layer of the microprocessor module.
Figure 7:
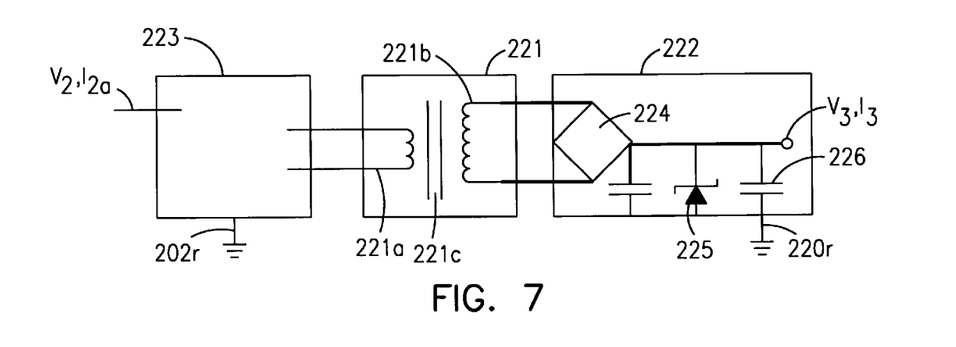
FIG. 7 is a block diagram representation of a voltage converter circuit (commonly a switching power supply) in accordance with the present invention.
Figure 8:
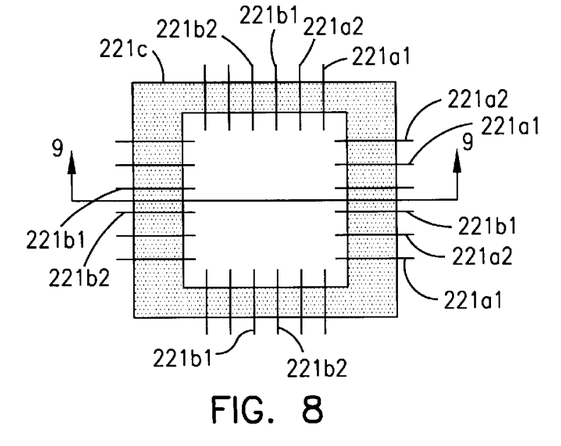
FIG. 8 is a top view of a thin film transformer embedded in the substrate showing the metal layer arrangement used to form the primary and secondary windings in accordance with the present invention.
Figure 9:
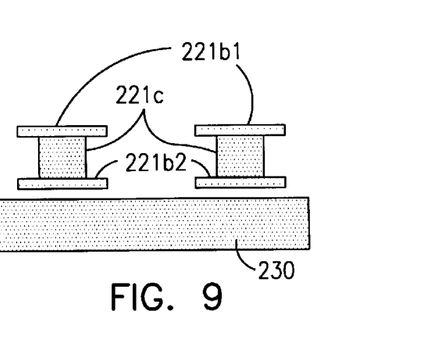
FIG. 9 is a cross-section view taken along line 9—9 in FIG. 8 illustrating the ferromagnetic material between metal layers which are interconnected according to turns ratio requirements using metal vias to form helical windings for the primary and secondary in accordance with the present invention.

FIG. 4 is a block diagram overview of a microprocessor module 200 in accordance with the teachings of the present invention. As depicted, microprocessor system 200 comprises a substrate 230 (formed typically from alumina, epoxy, or BCB type of material used on printed wiring boards PWB), a plurality of level 2 (L2) cache chips 240c, a plurality of embedded voltage converters 220a, 220n supplying power to a microprocessor silicon chip comprising an array of logic gates 210. An L2 cache differs from a level 1 cache in that the level 1 cache is included with the processor. FIG. 5 further shows, by example, a microprocessor gate 210 adapted for being energized from one of the plurality of voltage converters 220a, 220n, in accordance with the present invention. As depicted, voltage converter 220a comprises components 221, 222, and 223 embedded in deep wells of substrate 230. Voltage V3 is distributed to and from microprocessor chip 210 through electrical interconnections 205. FIG. 6 shows an enlarged section of a microprocessor chip illustrating logic gates 210 being powered from a voltage converter 220a comprising components 221, 222, and 223 disposed within the substrate 230 layer of the microprocessor module. The voltage converter's power conversion components, shown here as a switching power supply, comprise a thin film high frequency transformer 221 with a front-end pulse width modulator circuit 223 and an output voltage regulator 222 disposed within substrate layer 230. Each voltage converter would span a distance D equal to approximately 1 mm. FIG. 6 also shows input/output leads 201 and power input leads 202 attached to substrate 230. With the present invention, these power supply leads do not have to be duplicated as hundreds of pairs, as in the prior art. An additional advantage of deleting highly redundant power/ground pairs is controlled transmission line impedance within substrate 230. FIG. 6 further shows electrical connections 205, by example solder bumps, electrically interfacing between voltage converter 220a and the microprocessor logic gates 210. FIG. 7 shows a block diagram schematic representation of a voltage converter circuit topology, such as 220a, 220n, for converting a high input voltage V2 to a lower output voltage V3 for utilization by a selected group of microprocessor logic gates in accordance with the present invention. Each voltage converter would be a low wattage embedded device, typically rated at one (1) output watt. By example, voltage converter 220a, 220n would receive voltage V2 at a pulse width modulator circuit (PWM), 223 operable to generate a chopped square wave at a high kilo-hertz to low mega-hertz rate for transformation by a thin film transformer 221, comprising a primary winding 221a and a secondary winding 221b, and ferromagnetic material 221c. The secondary voltage output would be appropriately regulated by regulator means 222, comprising rectifier means 224, reference Zener voltage regulator 225, and noise suppression decoupling capacitor 226. Preferably, each voltage converter would have ground planes 220r isolated from high voltage ground return planes 202r. Thin film transformer 221 would comprise a substantially small (micro-meter range) ferromagnetic material interleaved using metal layers as depicted in FIG. 8. By example, FIGS. 8 and 9 show a thin film transformer 221 embedded in the substrate 230 having metal layers 221a1, 221a2, forming a single primary winding, and metal layers 221b1 and 221b2 arranged for forming multiple secondary windings 221b, in accordance with the present invention. FIG. 9, in particular, shows a crosssection view taken along line 9—9 in FIG. 8 illustrating the ferromagnetic material 221c between metal layers 221b1 and 221b2 which are interconnected according to turns ratio requirements using metal feed-through vias to form helical windings for the primary and secondary, in accordance with the present invention.

Figure 10:
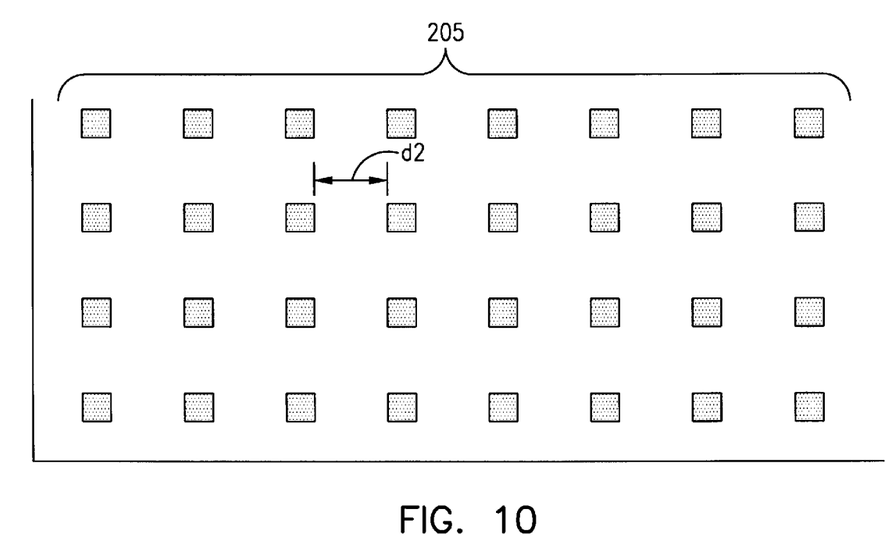
FIG. 10 is a grid representation of electrical connections termed bumps between a voltage converter and a flip chip containing microprocessor load circuits and data input/outputs showing in particular a less dense pattern than the input/output pattern shown in FIG. 2.
Figure 11:
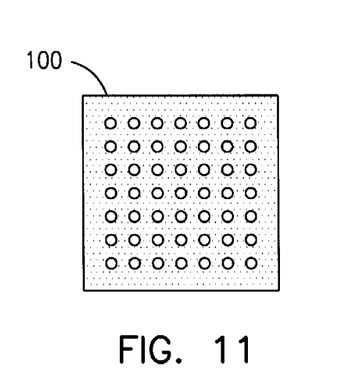
FIG. 11 shows a partial footprint for input/output leads for a prior art microprocessor module receiving a low voltage/high current operational power.
Figure 12:
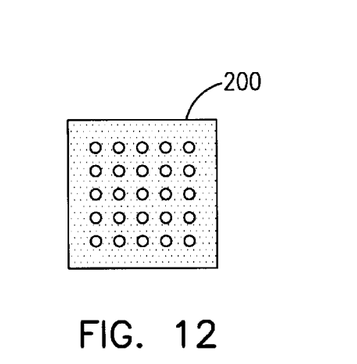
FIG. 12 shows the same functional partial footprint as in FIG. 11 for input/output leads for a microprocessor module receiving a high voltage/low current operational power in accordance with the present invention, illustrating a reduction in footprint in comparison to the footprint shown in FIG. 11.

FIGS. 10 and 12 illustrate an advantage over the prior art as depicted in FIGS. 2 and 11. FIG. 10 is a grid representation of electrical connections 205 which can be spaced at a wider pitch for flip chip technologies, denoted by numeral d2, than the pitch d1 denoted in FIG. 2. A typical pitch value for flip chip technology using the prior art would be 500 um. A still wider pitch, such as a 700 um, can be realized using the on-board voltage converters in accordance with the present invention, to facilitate a less dense pattern than that shown in FIG. 2. The high density of I/O depicted in FIG. 2 results, by example, in a footprint for a microprocessor 100 that is larger than the footprint for a microprocessor 200 employing the present invention. The primary reason for the reduction in footprint size is that the high voltage/low current power distribution of the present invention does not require massively redundant power/ground leads. The power/ground distribution redundancy is inside the microprocessor module which does not inflate the external lead count, hence a smaller footprint. FIGS. 11 and 12 show a relative improvement in foot print size using the present invention. FIG. 11 shows a partial footprint (five percent (5%) of total area and input/output lead count) for input/output leads for a prior art microprocessor module 100 receiving a low voltage/high current operational power, while FIG. 12 shows a partial footprint (five percent (5%) of total area and input/output lead count) for input/output leads for a microprocessor module 200 receiving a high voltage/low current operational power, in accordance with the present invention, and illustrating a reduction in footprint size in comparison to the footprint shown in FIG. 11.

The present invention has been particularly shown and described with respect to certain preferred embodiments and features thereof. However, it should be readily apparent to those of ordinary skill in the art that various changes and modifications in form and detail may be made without departing from the spirit and scope of the inventions as set forth in the appended claims. The inventions illustratively disclosed herein may be practiced without any element which is not specifically disclosed herein.

I claim:

1. An integrated microelectronic circuit apparatus, said apparatus comprising:

a multi-layer integrated microelectronic circuit arrangement, said circuit arrangement comprising a microprocessor chip having a substantially large number of electronic circuits operable upon being electrically energized by on board generated power supply voltage sources;

a substrate layer member of said multi-layer integrated microelectronic circuit arrangement, said substrate layer member having a plurality of input and output pins for electrically and electronically communicating with said circuit arrangement, said plurality of input and output pins including a plurality of power supply voltage input pins electrically designed for collectively receiving an external power supply voltage source at a first current rated value and for returning a corresponding external power supply ground return current; and a plurality of power supply voltage converters included in said circuit arrangement, each power supply voltage converter having micro-meter sized power supply voltage conversion components embedded in said substrate for generating a respective one of said on-board generated power supply voltage sources at a point of use location on said substrate layer member, each said on-board generated power supply voltage source having a voltage magnitude that is less than 2.5 Vdc and substantially less than said external power supply voltage source and being current rated for supplying a load current to a substantially small group of electronic circuit members of said substantially large number of electronic circuits, said substrate layer member having a first plurality of circuit lands electrically interconnecting said plurality of power supply voltage input pins to respective input sides of said plurality of power supply voltage converters for facilitating distribution of said external power supply voltage to each one of said plurality of power supply voltage converters, each power supply voltage converter being electrically coupled at a point of use via a second plurality of circuit lands to a respective one of said group of electronic circuit members, each circuit land of said second plurality of circuit lands being exposed to said on-board generated power supply voltage source at a current density that is less than a current density limit of said circuit land.

2. An integrated microelectronic circuit apparatus, as described in claim 1, wherein:

said substantially large number of electronic circuits comprise at least 1000 microprocessor logic gates; and said external power supply voltage source ranging from 20 Vdc to 60 Vdc, and said plurality of power supply voltage converters comprise at least 50 power supply voltage converters, each power supply voltage converter being rated to deliver a voltage magnitude in a range of 2.0 Vdc to 0.75 Vdc and a full range of load current to a substantially fewer quantity of said at least 1000 microprocessor logic gates.

3. An integrated microelectronic circuit apparatus, as described in claim 2, wherein:

said power supply voltage conversion components comprise a high frequency voltage converter operational in the Mhz frequency range comprising a pre-regulator pulse width modulator and controller circuit, a thin film transformer, and output voltage regulator circuit, said thin film transformer having a primary winding for receiving a Mhz range chopped voltage generated from said external power supply voltage source, and having a secondary winding that feeds said output voltage regulator circuit for generating said on-board generated power supply voltage source.

4. An integrated microelectronic circuit apparatus, as described in claim 3, wherein:

said voltage regulator comprises a rectifier, a Zener reference voltage generator and at least one noise decoupling capacitors.

5. An integrated microelectronic circuit apparatus, as described in claim 3, wherein:

each said thin film transformer having said primary and secondary windings formed by interconnecting metal layers embedded in said substrate layer member in a helical pattern about embedded ferromagnetic material.

6. An integrated microelectronic circuit apparatus, as described in claim 1, wherein:

said plurality of substantially large number of electronic circuits comprise at least 1000 microprocessor logic gates electrically connected to said substrate layer member via solder bump means electrically contacting said second plurality of circuit lands, said plurality of power supply voltage converters being disposed on said substrate layer member in a pattern consisting of a plurality of rows and columns, each power supply voltage converter supplying said on-board generated power supply voltage source to a substantially fewer quantity of said at least 1000 microprocessor logic gates.

7. An integrated microelectronic circuit apparatus, as described in claim 6, wherein:

said power supply conversion components comprise a high frequency voltage converter operational in the MHz frequency range comprising a pre-regulator pulse width modulator and controller circuit, a thin film transformer, and output voltage regulator circuit, said thin film transformer having a primary winding for receiving a MHz range chopped voltage generated from said external power supply voltage source, and having a secondary winding that feeds said output voltage regulator circuit for generating said on-board generated power supply voltage source.

8. An integrated microelectronic circuit apparatus, as described in claim 1, wherein:

said voltage regulator comprises a rectifier, a Zener reference voltage generator and at least one noise decoupling capacitor.

9. An integrated microelectronic circuit apparatus, as described in claim 7, wherein:

each said thin film transformer having said primary and secondary windings formed by interconnecting metal layers embedded in said substrate layer member in a helical pattern about embedded ferromagnetic material.

10. A microprocessor module apparatus, said apparatus comprising:

a multi-layer integrated microelectronic circuit arrangement, said circuit arrangement comprising a microprocessor chip having at least 1000 logic gates operable upon being electrically energized by on-board generated power supply voltage sources;

a substrate layer member of said multi-layer integrated microelectronic circuit arrangement, said substrate layer member having a plurality of input and output pins for electrically and electronically communicating with said circuit arrangement, said plurality of input and output pins including a plurality of power supply voltage input pins electrically designed for collectively receiving an external power supply voltage source at a first current rated value and for returning a corresponding external power supply ground return current; and a plurality of power supply voltage converters included in said circuit arrangement, each power supply voltage converter having micro-meter sized power conversion components for generating a respective one of said on-board generated power supply voltage sources at a point of use location on said substrate layer member, each said on-board generated power supply voltage source having a voltage magnitude in a range of 2.0 Vdc to 0.75 Vdc and being substantially less than said external power supply voltage source such that a ratio of said external power supply voltage to said on-board generated power supply voltage comprises a ratio of at least 5:1 to as much as 100:1, and being current rated for supplying a load current to a selected small group of said at least 1000 microprocessor logic gates, said substrate layer member having a first plurality of circuit lands electrically interconnecting said plurality of power supply voltage input pins to respective input sides of said plurality of power supply voltage converters for facilitating distribution of said external power supply voltage to each one of said plurality of power supply voltage converters, each power supply voltage converter being electrically coupled at a point of use via a second plurality of circuit lands to a respective one of said selected small group of logic gates, each circuit land of said second plurality of circuit lands being exposed to said range of said on-board generated power supply voltage source at a current density that is less than a current density limit of said circuit land.

11. A microprocessor module apparatus, as described in claim 10, wherein:

said power supply voltage conversion components comprise a high frequency voltage converter operational in the MHz frequency range comprising a pre-regulator pulse width modulator and controller circuit, a thin film transformer, and output voltage regulator circuit, said thin film transformer having a primary winding for receiving a MHz range chopped voltage generated from said external power supply voltage source, and having a secondary winding that feeds said output voltage regulator circuit for generating said on-board generated power supply voltage source.

12. A microprocessor module apparatus, as described in claim 11, wherein:

said voltage regulator comprises a rectifier, a Zener reference voltage generator and at least one noise decoupling capacitor.

13. A microprocessor module apparatus, as described in claim 11, wherein:

each said thin film transformer having said primary and secondary windings formed by interconnecting metal layers embedded in said substrate layer member in a helical pattern about embedded ferromagnetic material.

14. A microprocessor module apparatus, as described in claim 10, wherein:

said at least 1000 logic gates being electrically connected to said on-board generated power supply voltage source via solder bump means contacting said second plurality of circuit lands, said plurality of power supply voltage converters being disposed on said substrate layer member in a pattern consisting of a plurality of rows and columns, each power supply voltage converter supplying said on-board generated power supply voltage source to said selected small group of logic gates.

15. A microprocessor module apparatus, as described in claim 14, wherein:

said power conversion components comprise a high frequency voltage converter operational in the MHz frequency range comprising a pre-regulator pulse width modulator and controller circuit, a thin film transformer, and output voltage regulator circuit, said thin film transformer having a primary winding for receiving a MHz range chopped voltage generated from said external power supply source, and having a secondary winding that feeds said output voltage regulator circuit for generating said on-board generated power supply voltage source.

16. A microprocessor module apparatus, as described in claim 15, wherein:

said voltage regulator comprises a rectifier, a Zener reference voltage generator and at least one noise decoupling capacitor.

17. A microprocessor module apparatus, as described in claim 15, wherein:

each said thin film transformer having said primary and secondary windings formed by interconnecting metal layers embedded in said substrate layer member in a helical pattern about embedded ferromagnetic material.

18. A microprocessor module apparatus, said apparatus comprising:

a multi-layer integrated microelectronic circuit arrangement, said circuit arrangement comprising a microprocessor chip having at least 1000 logic gates operable upon being electrically energized by on-board generated power supply voltage sources;

a substrate layer member of said multi-layer integrated microelectronic circuit arrangement, said substrate layer member having a plurality of input and output pins for electrically and electronically communicating with said circuit arrangement, said plurality of input and output pins including a plurality of power supply voltage input pins electrically designed for collectively receiving an external power supply voltage source at a first current rated value and for returning a corresponding external power supply ground return current; and at least fifty power supply voltage converters included in said circuit arrangement, each power supply voltage converter having micro-meter sized power conversion components for generating a respective one of said on-board generated second power supply voltage sources at a point of use location on said substrate layer member, each said on-board generated power supply voltage source having a voltage magnitude in a range of 2.0 Vdc to 0.75 Vdc and being substantially less than said external power supply voltage source such that a ratio of said external power supply voltage to said on-board generated power supply voltage comprises a ratio of at least 5:1 to as much as 100:1, and being current rated for supplying a load current to a selected small group of said at least 1000 microprocessor logic gates, said substrate layer member having a first plurality of circuit lands electrically interconnecting said plurality of power supply voltage input pins to respective input sides of said at least fifty power supply voltage converters for facilitating distribution of said external power supply voltage source to each one of said at least fifty power supply voltage converters, each of said at least fifty power supply voltage converter being electrically coupled at a point of use location to a respective one of said selected small group of logic gates via solder bump means contacting a second plurality of circuit lands on said substrate layer member.

19. A microprocessor module apparatus, as described in claim 18, wherein:

said voltage regulator comprises a rectifier, a Zener reference voltage generator and at least one noise decoupling capacitor.

20. A microprocessor module apparatus, as described in claim 18, wherein:

each said thin film transformer having said primary and secondary windings formed by interconnecting metal layers embedded in said substrate layer member in a helical pattern about embedded ferromagnetic material.

21. A method of powering a high power microprocessors, said method comprising the steps of:

(a) providing a microprocessor module apparatus, said apparatus comprising:

a microprocessor chip having at least 1000 logic gates operable upon being electrically energized by on-board generated power supply voltage sources;

a substrate layer members, said substrate layer member having a plurality of input and output pins for electrically and electronically communicating with said microprocessor chip, said plurality of input and output pins including a plurality of power supply voltage input pins electrically designed for collectively receiving an external power supply voltage source at a first current rated value and for returning a corresponding external power supply ground return current; and at least fifty power supply voltage converters, each power supply voltage converter having micro-meter sized power conversion components for generating a respective one of said on-board generated power supply voltage sources at a point of use location on said substrate layer member, each said on-board generated power supply voltage source having a voltage magnitude in a range of 2.0 Vdc to 0.75 Vdc and being substantially less than said external power supply voltage source such that a ratio of said external power supply voltage to said on-board generated power supply voltage comprises a ratio of at least 5:1 to as much as 100:1, and being current rated for supplying a load current to a selected small group of said at least 1000 microprocessor logic gates, said substrate layer member having a first plurality of circuit lands electrically interconnecting said plurality of power supply voltage input pins to respective input sides of said at least fifty power supply voltage converters for facilitating distribution of said external power supply voltage source to each one of said at least fifty power supply voltage converters, each of said at least fifty power supply voltage converter being electrically coupled at a point of use location to a respective one of said selected small group of logic gates via solder bump means contacting a second plurality of circuit lands on said substrate layer member;

(b) distributing said external power supply voltage source to said plurality of power supply voltage input pins;

(c) further distributing said external power supply voltage source to respective ones of said at least fifty power supply voltage converters;

(d) converting said external power supply voltage source to said on-board generated power supply voltage source; and (e) distributing said on-board generated power supply voltage source via said solder bump means and powering respective ones of said selected small group of logic gates.

* * * * *

UNITED STATES PATENT AND TRADEMARK OFFICE
CERTIFICATE OF CORRECTION

PATENT NO : 5,914,873
DATED : June 22, 1999
INVENTOR(S): Richard C. Blish, II

It is certified that error appears in the above-identified patent and that said Letters Patent is hereby corrected as shown below:

Claim 4, line 63 the word "capacitors" should be "capacitor".

Claim 21, the first sentence "microprocessors" should be "microprocessor".
Claim 21, line 12 the word "members" should be "member".

Signed and Sealed this

Twenty-first Day of March, 2000

Q. TODD DICKINSON

*Attest:*

*Attesting Officer*     *Commissioner of Patents and Trademarks*